United States Patent [19]

Karol

[11] 4,086,114

[45] Apr. 25, 1978

[54] ALUMINUM SURFACE TREATMENT TO ENHANCE ADHESION IN A GIVEN DIRECTION

[75] Inventor: Kenneth N. Karol, Boulder, Colo.

[73] Assignee: International Business Machines Corporation, Armonk, N.Y.

[21] Appl. No.: 761,025

[22] Filed: Jan. 21, 1977

Related U.S. Application Data

[60] Continuation of Ser. No. 580,642, May 27, 1975, abandoned, which is a continuation of Ser. No. 463,639, Apr. 24, 1974, abandoned, which is a division of Ser. No. 349,137, Apr. 9, 1973, Pat. No. 3,838,506.

[51] Int. Cl.² ............................................. B32B 31/00
[52] U.S. Cl. ................................... 156/153; 134/2; 156/219; 204/58
[58] Field of Search ............... 156/629, 645, 665, 153, 156/209, 219; 204/27, 23, 33, 38 A, 58; 15/77; 134/2

[56] References Cited

U.S. PATENT DOCUMENTS

| | | | |
|---|---|---|---|
| 3,249,958 | 5/1966 | Haracz | 15/77 |
| 3,498,870 | 3/1970 | Fritchey | 156/153 |
| 3,674,619 | 7/1972 | Scher et al. | 156/209 |
| 3,891,516 | 6/1975 | Chu | 204/33 |
| 3,928,527 | 12/1975 | Wohnhaas et al. | 156/209 |
| 3,935,080 | 1/1976 | Gumbinner et al. | 204/33 |
| 4,011,150 | 3/1977 | Peterson | 156/645 |

*Primary Examiner*—William A. Powell
*Assistant Examiner*—Jerome W. Massie
*Attorney, Agent, or Firm*—Joscelyn G. Cockburn

[57] ABSTRACT

A thin sheet of electrical grade aluminum is secured to a thin substrate sheet of epoxy/fiberglass or polyimide/fiberglass to form a multilayer card. This card is processed by printed circuit techniques to form the electrical circuit pattern of a printed circuit motor armature. The surface of the aluminum sheet which confronts the substrate sheet is processed in a manner to have a continuous pattern of oblong depressions generally normal to the surface. The major axes of these depressions are generally aligned with each other, and define the direction of the higher adhesion strength. The major axes of these depressions are in alignment with the direction of the electrical conductors constituting the armature circuit pattern. The aluminum surface, containing these depressions, includes a thin, clear, continuous unsealed anodized coating.

3 Claims, 6 Drawing Figures

U.S. Patent  April 25, 1978  Sheet 1 of 2  4,086,114
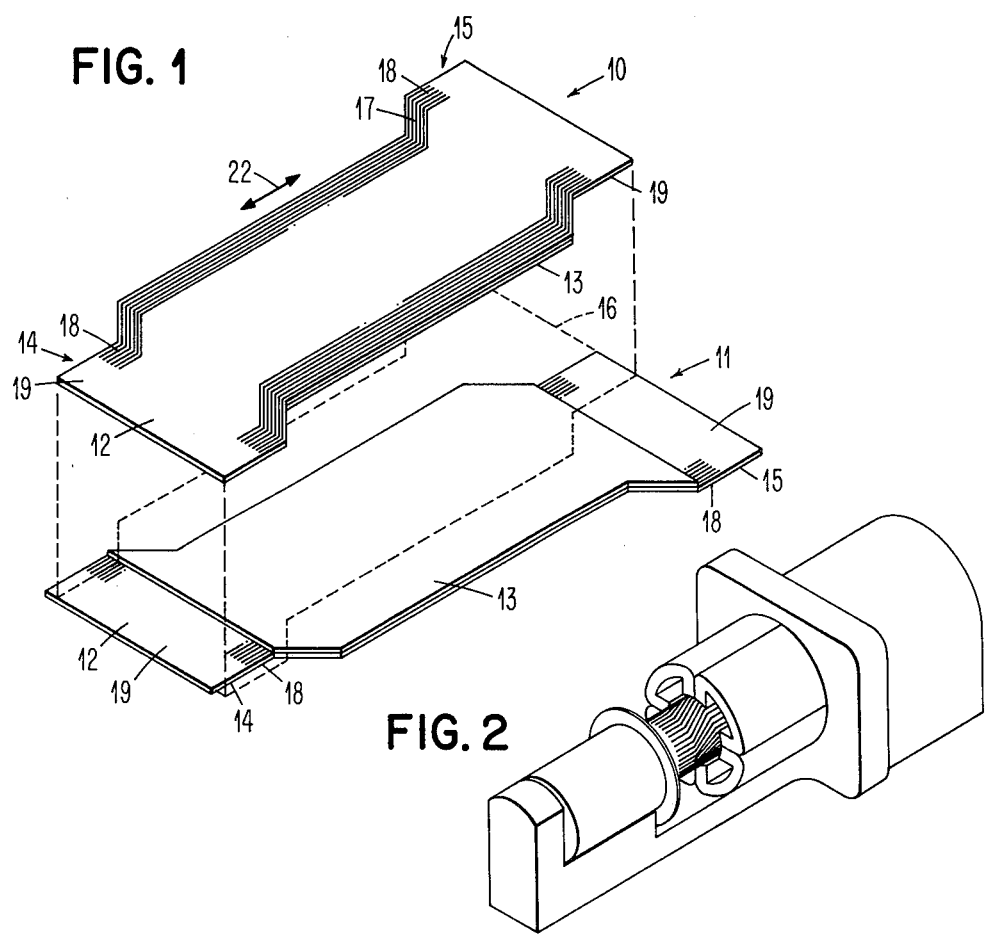
FIG. 1
FIG. 2
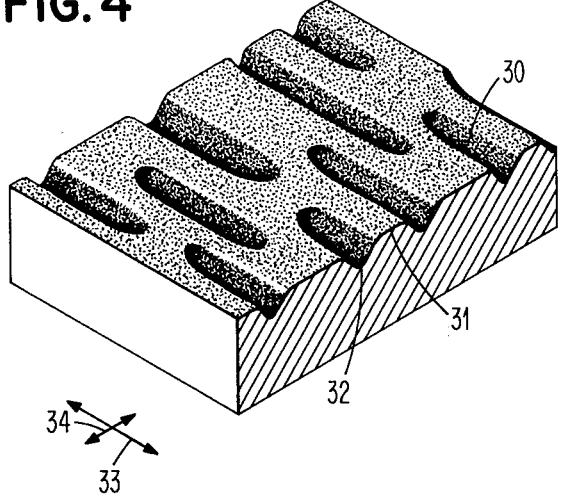
FIG. 4
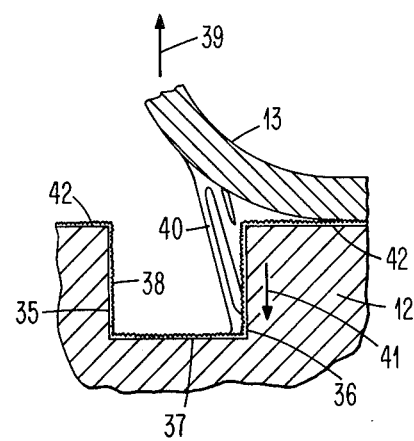
FIG. 5

ALUMINUM SURFACE TREATMENT TO ENHANCE ADHESION IN A GIVEN DIRECTION

This is a continuation of application Ser. No. 580,642 filed May 27, 1975, now abandoned, which is a continuation of Ser. No. 463,639 filed Apr. 24, 1974, now abandoned, which is a division of Ser. No. 349,137 filed Apr. 9, 1973, now U.S. Pat. No. 3,838,506.

BACKGROUND OF THE INVENTION

Numerous prior art teachings deal with surface preparation of an aluminum member prior to adhesive bonding, as by grit blasting or acid etching, to thereby enhance bonding adhesion.

For example, an aluminum-plastic laminate has been formed by roughening the surfaces of a pair of aluminum sheets, subsequently etching these surfaces with a sulfochromate solution, and thereafter bonding the treated aluminum surfaces together, under heat and pressure, by inserting a thermoplastic layer therebetween.

Another method improves adhesive bonding of aluminum, or its alloys, to organic adhesives by first treating the aluminum surface with a sulfochromate solution, and then treating the surface with a reducing solution.

Yet another method enhances adhesion to aluminum by providing a layer of liquid adhesive containing a finely divided solid abrasive, followed by movement to abrade the confronting surfaces, and then curing the adhesive to bond these surfaces together.

SUMMARY OF THE INVENTION

This invention relates to the field of adhesive bonding of a multilayered card to form a laminate, and more specifically to the unique treatment of one surface of a thin, solid sheet of electrical grade aluminum prior to lamination thereof to a thin substrate sheet of electrical insulation.

Specifically, this invention relates to an article and to a method of making the article, namely multilayer cards. The resulting cards are capable of withstanding high temperature with minimal degradation in the bonding of the card's layers. This invention provides a unique aluminum surface which does not require the use of acids or the like, and which does not leave the aluminum surface with a layer of contamination. After surface preparation, the surface is covered with a clear, unsealed and continuous anodize coating. This coating prevents the formation of aluminum oxide prior to lamination, and thereby allows time to elapse prior to the bonding step. This coating also enhances bonding adhesion.

More specifically, the aluminum's unique surface configuration comprises a substantially continuous pattern of oblong depressions, having a depth in the range of 0.0001 to 0.0002 inch, preferably formed by mechanical means such as wire brushing, brushing with abrasive mineral coated fibers, or embossing so as to leave a clean, uncontaminated surface. The major axes of these depressions are generally aligned in the direction of highest lamination strength. The anodize coating, which is placed over this aluminum surface configuration, is such that if placed on a flat surface, the thickness of the deposit would be a layer of anodize approximately 0.0001 to 0.0002 inch thick.

Such a method, and the article produced thereby, provides high lamination bonding adhesion, in the range of 20 to 30 pounds per inch, as measured by standard NEMA peel tests as described for copper laminates. This high bonding strength insures good adhesion at high temperatures.

The foregoing and other features and advantages of the invention will be apparent from the following more particular description of a preferred embodiment of the invention, as illustrated in the accompanying drawing.

BRIEF DESCRIPTION OF THE DRAWING

FIG. 1 is an exploded view of two multilayer circuit card articles embodying the present invention, FIG. 2 is a view of a magnetic tape unit capstan motor whose hollow tubular armature is made from the two circuit cards of FIG. 1, FIGS. 3A and 3B are greatly enlarged photographic views of the aluminum sheet's textured surface which confronts the substrate layer of each of the two cards of FIG. 1.

FIG. 4 is an idealized sketch of a portion of the surface of FIGS. 3A and 3B, and is helpful in understanding the results achieved by the present invention, and FIG. 5 is an idealized sketch of the aluminum surface formed by embossing, and is helpful in understanding the results achieved by the present invention.

DESCRIPTION OF THE PREFERRED EMBODIMENT

Figure 3A:
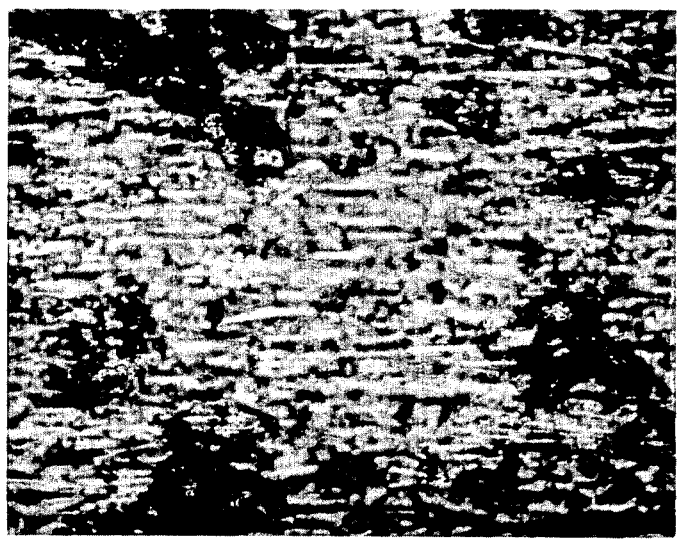
in FIG. 3A, the camera is focused on the upper surface plane formed by the surface ridges.
Figure 3A:
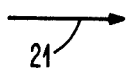

FIG. 1 discloses two multilayered circuit cards 10 and 11, as made by the practice of the present invention. These flat, laminated cards are formed from a thin sheet of electrical grade aluminum 12 which is laminated or bonded to a thin sheet of fully cured epoxy/fiberglass or polyimide/fiberglass 13. By way of example, aluminum layer 12 may have a thickness of 5 mils and insulating substrate layer 13 may have a thickness of 2.5 mils. At the end portions 14 and 15, which will eventually be the aluminum innerconnecting tabs for the inner and outer armature winding conductors of a hollow, tubular aluminum armature, substrate layer 13 has been removed to expose spaced surfaces of aluminum 14 and 15 on the substrate side of each of the cards. Card 10 is positioned in abutting relationship to card 11, as shown by broken lines 16.

A more detailed description of cards 10 and 11, and the manner by which the two cards are formed into a tubular armature is contained in U.S. Pat. No. 3,650,021, issued to K. N. Karol. An alternate method of forming two such cards into a tubular armature is disclosed in U.S. Pat. No. 3,763,551, issued to C. C. Herron.

The use of a superpolymer support substrate in the armature of a high torque — low inertia motor is described in the IBM TECHNICAL DISCLOSURE BULLETIN, Volume 15, Number 3, August 1972, at page 705.

An electric motor armature formed from the circuit cards shown in FIG. 1 is particularly adapted for use in a high torque — low inertia motor. The present invention, while being described in relation to its advantageous use in manufacturing a tubular armature, is not to be restricted thereto.

An example of a high torque — low inertia motor wherein an armature of this general type finds utility is that disclosed in U.S. Pat. No.3,490,672, issued to G. A. Fisher and H. E. Van Winkle.

When the sheet of aluminum 12 is initially laminated to substrate sheet 13, the sheet is solid and does not have circuit conductors formed therein. After the cards have been laminated, and prior to the cards being joined one to the other in tubular shape, individual circuit conductors 17 are formed in the aluminum sheet, as by printed circuit techniques, as shown in FIG. 1. Each of the conductors terminates at a tab portion 18 and includes selvage 19 which will be removed during formation of the tubular armature. The major length of each of the conductors 17 is in alignment with arrow 22, FIG. 1, and with arrow 33, FIG. 3.

The present invention relates to the aluminum surface and treatment thereof whereby bonding adhesion of aluminum sheet 12 to substrate sheet 13 is greatly enhanced, to thereby provide a high torque — low inertia armature which will withstand high operating temperatures without significant bonding deterioration.

Figure 3B:
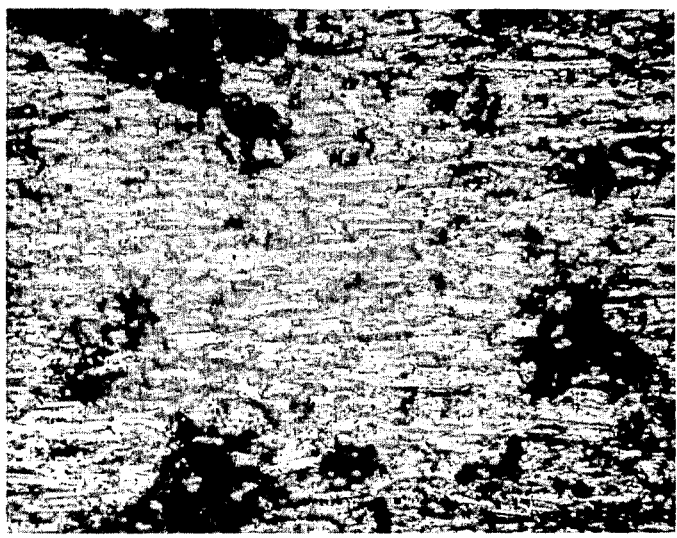
in FIG. 3B, the camera is focused on the lower surface plane formed by the surface valleys.
Figure 3B:
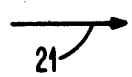

FIGS. 3A and 3B are photographic views, enlarged 400 times, showing the surface of aluminum sheet 13, which abuts substrate sheet 13. In these views, the unique surface configuration, consisting of a continuous pattern of oblong depressions, the major axes of which are in general alignment with arrow 21 can be seen. The physical dimension of the photographed specimen, measured normal to arrow 21, is approximately 0.008 inch.

In accordance with the present invention, the texturing treatment shown in FIGS. 3A and 3B are preferably accomplished by mechanical means, for example by the use of an embossing die or by the use of brushing. The textured surface of FIGS. 3A and 3B was prepared by a wire brushing method produces a random pattern of oblong depressions. Specifically, the electrical grade aluminum sheet shown in FIGS. 3A and 3B was subjected to a wire brushing step having the following characteristics: one pass under two stainless steel rotary wire brushes having brush fibers with diameter of approximately 6-mil and whose speed is approximately 5,000 surface feet per minute with an aluminum sheet feed speed of approximately 5 surface feet per minute against the direction of brush rotation.

After the aluminum surface is textured, as in FIGS. 3A and 3B, it is detergent cleaned, rinsed, cold sulfuric acid deoxidized, and again rinsed. Next it is sulfuric acid anodized, 18% to 20% sulfuric acid by weight, at approximately 18 amperes per square foot and 20 volts, at 80%F, and then left unsealed. The anodize step is controlled such that if the anodize were being placed on a flat surface, the anodize layer would be from 0.0001 to 0.0002 inch thick. This anodize layer not only protects the underlying aluminum surface from subsequent oxidation, but also forms a minor dimension texture to the aluminum surface to aid in achieving high bonding adhesion.

The wire brushing, above described, produces oblong depressions, having a depth in the range of 0.0001 to 0.0002 inch, whose major axes extend in the direction of brushing. This range is not to be considered a limitation on the broader aspects of this invention. The minimum depth in this range is selected to achieve at least the desired adhesion. The maximum depth in this range, of course, enhances adhesion. However, one must keep in mind the fact that too deep depressions reduce the electrical conductor's thickness and thereby increase the conductor's resistance in such area, leading to circuit higher resistance areas and overall increased circuit resistance. With these constraints in mind, the above defined range is preferred for aluminum in the range of 0.005 inch thick. The aluminum thickness is selected with motor parameters in mind, such as armature inertia, air gap size, armature circuit resistance, etc.

Mechanical texturing treatment of the aluminum surface is preferred in that such treatment leaves a relatively clean surface, or one that can be readily cleaned, and does not produce surface contamination normally associated with other surface treatment methods, such as those using etchants.

The uniquely textured surface shown in FIGS. 3A and 3B is constructed and arranged to create oblong depressions whose sides constitute surface components which extend generally normal to the major surface plane of the aluminum sheet. These surface components create shear forces which are in direct opposition to forces tending to cause peel of laminate 12–13. The mechanics of film adhesion and peel tests by which such adhesion is analyzed is described in the IBM JOURNAL OF RESEARCH AND DEVELOPMENT, the May 1972 issue, beginning at page 203.

The surface configuration of FIGS. 3A and 3B resulting forces which resist lamination peel are created by the oblong depressions which extend into the aluminum surface and are normal to the major lamination or confronting surface of the aluminum sheet. A unique characteristic of these depressions is that they are oblong and thus have minor and major axes, the major axes being in general alignment with arrow 21 of FIGS. 3A and 3B. As a further feature of the present invention, the general alignment of the major axes of these depressions, which define the direction of highest adhesion strength, are aligned with the major length 22 of the conductors 17 of FIG. 1. This alignment has been found to produce maximum adhesion and peel resistance in the high temperature/high acceleration operating environment of a high torque — low inertia armature.

FIG. 4 is an idealized sketch of a portion of aluminum sheet 12, greatly enlarged, showing the type of oblong depressions 30 which are formed into its surface as by wire brushing. These depressions define ridges 31 and valleys 32. The major axes of these depressions are generally aligned with arrow 33, whereas their minor axes are generally aligned with arrow 34.

FIG. 5 shows an idealized sketch of a portion of aluminum sheet 12, greatly enlarged. The textured surface of the aluminum sheet is formed by embossing, and thus the single depression shown has vertical sides 35 and 36, and a flat valley 37. The anodize layer, also shown in idealized form, is identified by reference numeral 38. Substrate layer 13 is shown in a peel situation, under the influence of a peel force 39. The adhesive layer 40, for example epoxy, is shown extending between layer 13 and the vertical wall 36 of the underlying depression. The force at wall 36 which resists lamination peel includes shear forces 41 which are in direct opposition to force 39 tending to cause peel of laminate 12–13. This resistance to peel is created by the oblong depression 35, 36, 37, and the portions 35, 36 thereof which extend into the aluminum surface and are normal to the major lamination or confronting surface 42 of the aluminum sheet. This geometry/force effect is enhanced by anodize layer 38.

While the invention has been particularly shown and described with reference to a preferred embodiment thereof, it will be understood by those skilled in the art that various changes in form and details may be made therein without departing from the spirit and scope of the invention.

What is claimed is:

1. In a method of laminating an aluminum member to an electrically insulative substrate member, an improved method of preparing the aluminum surface which is to be bonded to the substrate surface in order to enhance adhesion and resist peel in a given direction, comprising the steps of:

subjecting said aluminum surface to a texturing treatment, with mechanical means, to form a substantially continuous pattern of oblong depressions in said surface, said oblong depressions having substantially vertical sides, with a depth in the range of .0001 to .0002 inch, for creating shear forces which are being opposite to forces tending to cause peel and having major axes positioned in general alignment with said given direction of enhanced adhesion;

cleaning said texturized surface so as to remove all impurities, including aluminum oxide; and covering said textured surface with a continuous coating of clear, unsealed anodize.

2. The method defined in claim 1 wherein said mechanical means is provided by an embossing die.

3. In a method of laminating an aluminum member to an electrically insulative substrate member, an improved method of preparing the aluminum surface which is to be bonded to the substrate surface in order to enhance adhesion in a given direction, comprising the steps of:

subjecting said aluminum surface to a texturing treatment with rotating wire brushes having brush fibers with a diameter of approximately 6 mils and surface speed of approximately 5,000 feet-per-minute, with said aluminum having a sheet feed speed of approximately five surface feet per minute relative to the rotating brushes and against the direction of brush rotation so as to form a continuous pattern of oblong depressions in said surface, the major axes of said depressions being in general alignment with said given direction of enhanced adhesion;

cleaning said texturized surface so as to remove all impurities, including aluminum oxide; and covering said textured surface with a continuous coating of clear, unsealed anodize; said anodize having thickness of about 0.0001 to about 0.0002 inch.

* * * * *